United States Patent
Cooper

(10) Patent No.: US 6,577,139 B2
(45) Date of Patent: Jun. 10, 2003

(54) IMPEDANCE CONVERTER CIRCUIT

(75) Inventor: Frank G. Cooper, Dix Hills, NY (US)

(73) Assignee: Keystone Thermometrics, St. Marys, PA (US)

( * ) Notice: Subject to any disclaimer, the term of this patent is extended or adjusted under 35 U.S.C. 154(b) by 37 days.

(21) Appl. No.: 09/992,775

(22) Filed: Nov. 6, 2001

(65) Prior Publication Data

US 2003/0085717 A1 May 8, 2003

(51) Int. Cl.⁷ .......................... G01R 27/00; G01R 27/08
(52) U.S. Cl. ........................ 324/600; 324/692
(58) Field of Search ................................ 324/721, 600, 324/602, 603, 605, 606, 608, 691, 692, 704, 705; 600/537, 549, 504, 505

(56) References Cited

U.S. PATENT DOCUMENTS

| | | | | |
|---|---|---|---|---|
| 3,595,079 A | * | 7/1971 | Grahn | 73/204.15 |
| 4,820,971 A | * | 4/1989 | Ko et al. | 73/204.15 |
| 4,883,063 A | * | 11/1989 | Bernard et al. | 324/679 |
| 5,346,508 A | * | 9/1994 | Hastings | 600/483 |
| 5,656,928 A | * | 8/1997 | Suzuki et al. | 607/99 |
| 5,675,600 A | * | 10/1997 | Yamamoto et al. | 372/38.01 |
| 6,377,110 B1 | | 4/2002 | Cooper | |

OTHER PUBLICATIONS

"Thermometrics: What is a Thermistor?", http://www.thermometrics.com/htmldocs/whatis.htm, (© 1999 Thermometrics), downloaded Feb. 6, 2002.

"NTC Thermistors: Type MA", http://www.thermometrics.com/assets/images/ma.pdf, downloaded Feb. 6, 2002.

"NTC Thermistors", http://www.thermometrics.com/assets/images/ntcnotes.pdf, downloaded Feb. 6, 2002.

* cited by examiner

*Primary Examiner*—N. Le
*Assistant Examiner*—John Teresinski
(74) *Attorney, Agent, or Firm*—Michaelson & Wallace; Peter L. Michaelson; Janet M. Skafar

(57) ABSTRACT

An impedance converter module has a phase reversal circuit to receive a 2-wire excitation signal at first and second terminals, and to provide a polarized excitation signal with a predetermined polarity based on the 2-wire excitation signal. A series current path has a sense resistor connected in series with a variable impedance source. The polarized excitation signal is applied across the series current path. An output-voltage-sense circuit provides an output-voltage-sense signal based on a voltage across the series current path. A current mirror provides a drive signal to a ratiometric device based on current flowing through the series current path. Differential amplifiers receive a ratiometric response signal from the ratiometric device, and output measurement signals based on the ratiometric signal. A summing node combines the measurement signals to provide a single-ended ratiometric signal. The variable impedance source is controlled to provide a two-wire response signal at the 2-wire terminals based on the single-ended ratiometric signal and the output-voltage-sense signal.

20 Claims, 4 Drawing Sheets

IMPEDANCE CONVERTER CIRCUIT

BACKGROUND OF THE DISCLOSURE

1. Field of the Invention

The invention relates to an apparatus, specifically a circuit, that performs a three-wire ratiometric to two-wire excitation conversion.

2. Description of the Prior Art

Thermometry has many applications that cross a wide variety of technical disciplines including, but not limited to, temperature measurement, control and compensation. In one application, a thermistor type cardiac catheter is used to measure blood temperature for thermodilution studies. A saline or dextrose solution, having a known volume and temperature, is injected into the blood stream through one of the catheter lumens. The solution mixes with the blood and is diluted as it is carried downstream past a thermistor located at the surface of another catheter lumen. At the thermistor location, the temperature of the blood-injectate mixture is measured over a period of time. The cardiac output (efficiency) is computed from the temperature-time response data. Such temperature measurement depends, at least in part, on a resistance-temperature characteristic of the thermistor, also known as the beta characteristic.

The Association for the Advancement of Medical Instrumentation (AAMI) provides standards for the operation of electronic devices in medical equipment. These standards help to ensure the safety of the patient. For example, a catheter used to measure the temperature of blood inside a blood vessel will have more stringent operational parameters than a catheter used to monitor the body temperature rectally.

There are various types of catheters and connectors for the catheters. A first type of catheter that is used for cardiac thermodilution studies has a three-wire connector and a ratiometric response. This catheter operates under tight tolerances to ensure the safety of the patient. The current is kept to less than 50 microamperes and the voltage is kept to less than 800 millivolts. This catheter is very reliable and accurate, and is available at a low cost.

A second type of catheter that can be used for measuring body temperature, for example, rectally, has a two wire connector and a resistive response. The operational characteristics for the second type of catheter are not as stringent as for the first type of catheter. Therefore, this catheter cannot be used for cardiac thermodilution studies. Moreover, the second type of catheter may cost more than the first type of catheter.

In addition, the thermistors used in the first and second types of catheters may have different resistance-temperature characteristics. Over any specified temperature range for which the slope of a given material system curve may be considered to be constant, the resistance of a thermistor at any temperature within the specified range may be expressed as:

$$R_T = R_{TO} \exp\left[\frac{\beta(T_o - T)}{TT_o}\right],$$

where $R_T$ is the resistance at an absolute temperature T expressed in kelvins (° C.+273.15); $\beta$ is the "beta" or "material constant", and represents the slope of the thermistor's resistance-temperature characteristic (in kelvins) over the specified temperature range; and, $R_{TO}$ is the resistance at a specified reference temperature, $T_o$ that is also expressed in kelvins. Typically thermistor manufacturers provide beta information for their devices.

Monitors that attach to the second type of catheter provide a two-wire connector and expect a resistive response, and not a three wire connector with a ratiometric response. In addition, these monitors are designed for a specific resistance-temperature characteristic provided by a particular two-wire catheter. Therefore, catheters having a three-wire connector cannot be used with such monitors because of the differences in the connector and resistance-temperature characteristic. This increases cost and inconvenience because medical service providers need to have different types of catheters for the different monitors and measurements.

Therefore, there is a need for an apparatus that allows the three-wire catheter with the ratiometric response to be used with monitors having two-wire connectors and expecting a resistive response. This apparatus should also provide a two-wire response signal having a particular resistance-temperature characteristic over a predetermined temperature range.

SUMMARY OF THE INVENTION

The present invention satisfies this need by providing an impedance converter module that allows a 3-wire device with a ratiometric response to be used with a 2-wire monitor expecting a resistive response. An impedance converter module has a phase reversal circuit to receive a 2-wire excitation signal at first and second terminals, and to provide a polarized excitation signal with a predetermined polarity based on the 2-wire excitation signal. A series current path has a sense resistor connected in series with a variable impedance source. The polarized excitation signal is applied across the series current path. An output-voltage-sense circuit provides an output-voltage-sense signal based on a voltage across the series current path. A current mirror provides a drive signal to a ratiometric device based on current flowing through the series current path. Differential amplifiers receive a ratiometric response signal from the ratiometric device, and output measurement signals based on the ratiometric signal. A summing node combines the measurement signals to provide a single-ended ratiometric signal. The variable impedance source is controlled to provide a two-wire response signal at the 2-wire terminals based on the single-ended ratiometric signal and the output-voltage-sense signal.

In this way, the impedance converter module allows a device having a ratiometric response to be used with a monitor expecting a resistive response. The three-wire ratiometric signal from the device is converted to a two-wire output signal that has a desired output resistance over a predetermined range.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to some of the figures.

DETAILED DESCRIPTION OF THE PREFERRED EMBODIMENTS

Figure 1:
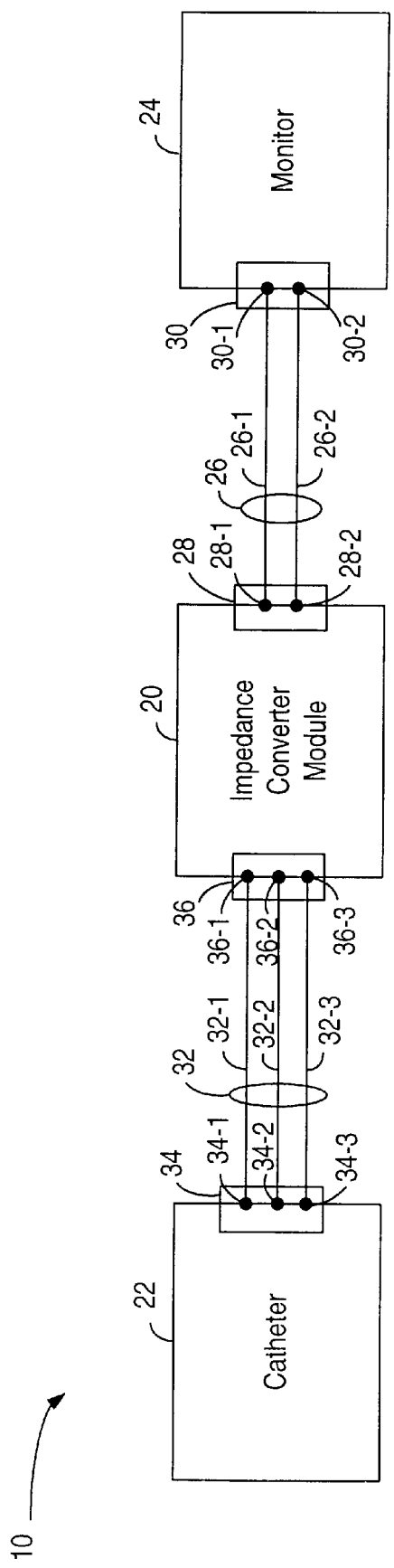
FIG. 1 depicts a high level block diagram of a system using the impedance converter module that connects a catheter having a 3-wire connector with a ratiometric response to a monitor having a 2-wire connector for connecting to a catheter having a resistive response.

Referring to FIG. 1, a high-level block diagram of a monitoring system 10 using the impedance converter module 20 of the present invention is shown. The impedance converter module 20 interfaces a 3-wire catheter 22 with a ratiometric response to a 2-wire monitor 24 expecting a resistive response.

A cable 26 connects the terminals 28-1 and 28-2 of the impedance converter module's 2-wire connector 28 to the terminals 30-1 and 30-2 of the monitor's 2-wire connector 30 via leads 26-1 and 26-2, respectively. Another cable 32 connects the terminals 36-1, 36-2 and 36-3 of the impedance converter module's 3-wire connector 36, to the terminals 34-1, 34-2 and 34-3 of the 3-wire connector 34 of the catheter 22 via leads 32-1, 32-2 and 32-3, respectively. The monitor 24 provides an excitation signal to the impedance converter module 20 via the 2-wire connectors 28 and 30, and expects a response signal with a predetermined resistance-temperature characteristic via the 2-wire connectors 28 and 30. Depending on the monitor 24, the excitation signal may be a constant current or a constant voltage. The impedance converter module 20 works with monitors that provide the excitation signal using a constant current, and also with monitors that provide the excitation signal using a constant voltage. In one embodiment, the 2-wire excitation signal is a predetermined constant voltage level and the 2-wire response signal is a current. In an alternate embodiment, the 2-wire excitation signal is a predetermined constant current, and the 2-wire response signal is a voltage. The impedance converter module 20 will be described with respect to a 2-wire excitation signal that is a current, and a 2-wire response signal that is a voltage.

The impedance converter module 20 receives the two-wire excitation signal from the monitor 24 via the 2-wire connector 30, and converts the two-wire excitation signal to a catheter drive signal that is applied to the catheter via the 3-wire connector 36. In response to the drive signal, the impedance converter module 20 receives a ratiometric response signal that represents a measured temperature from the catheter 22 via the 3-wire connector 36, and converts the ratiometric response signal to a two-wire response signal having a target resistance-temperature characteristic expected by the monitor 24 for a predetermined range of temperatures.

Figure 2:
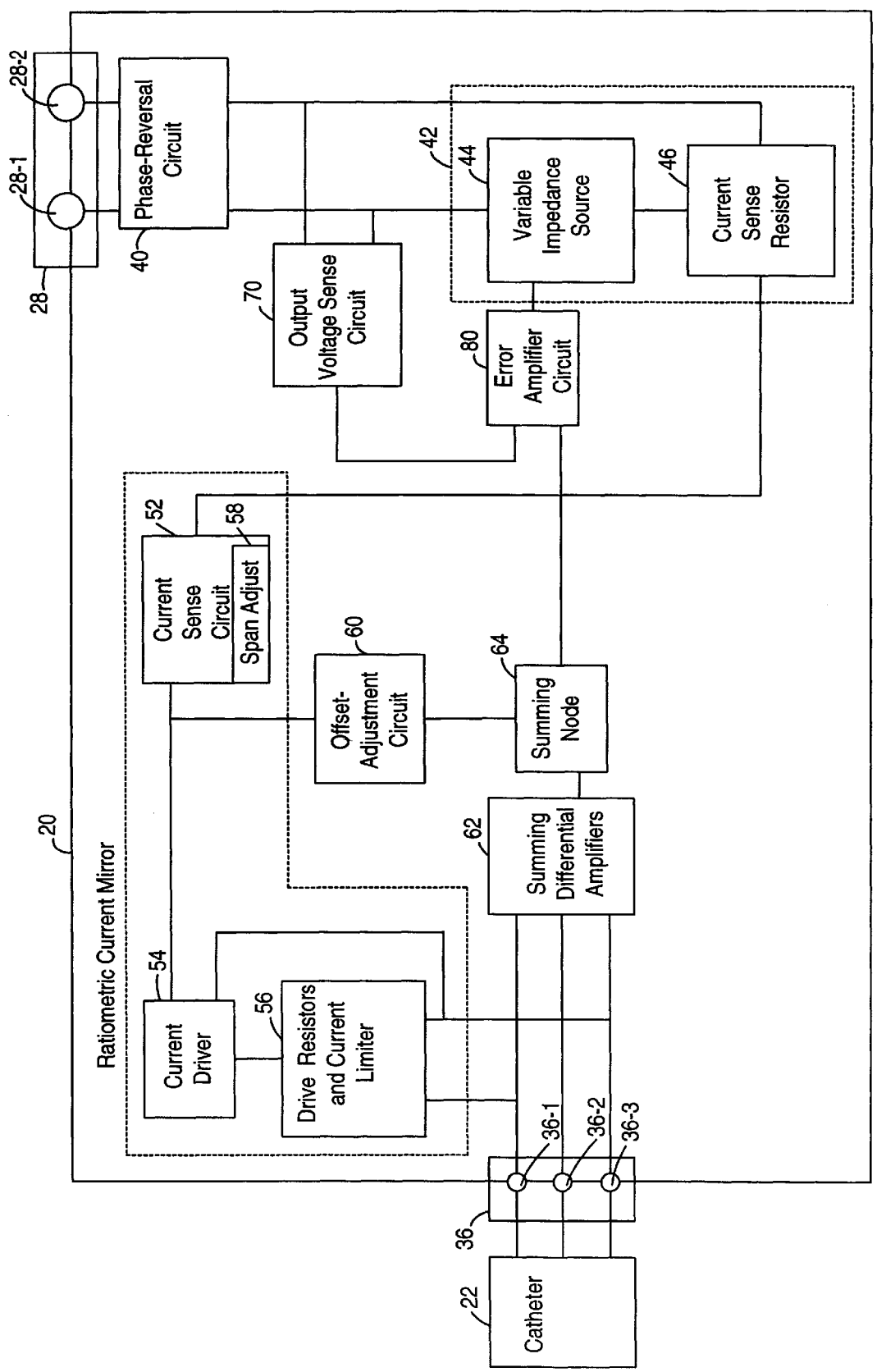
FIG. 2 depicts a high-level block diagram of the impedance converter module of FIG. 1.

FIG. 2 depicts a high-level block diagram of the impedance converter module 20 and 3-wire catheter 22 of FIG. 1. During operation, the monitor 24 is connected to the two-wire connecter 28, and provides the excitation signal. The polarity of the excitation signal is unknown because the cable 26 (FIG. 1) connecting the monitor 24 to the impedance converter module 20 may be plugged into the connector 28 or the connector 30 of the monitor 24 (FIG. 1) in either of two directions. To accommodate for the unknown polarity of the excitation signal, a phase-reversal circuit 40 receives the excitation signal and provides a polarized excitation signal with a predetermined polarity.

A series current path 42, with controlled polarity as described above, is provided across the two-wire connector terminals 28-1 and 28-2 through a variable impedance source 44 and a sense resistor 46. The variable impedance source 44 is controlled such that the 2-wire response signal has the target resistance-temperature characteristic.

A ratiometric current mirror 50 provides catheter drive current to drive the 3-wire catheter 22 based on the current flowing through the series current path 42. In particular, a current-sense circuit 52 senses the current flowing through the sense resistor 46 to provide a series-path-current signal. A current driver circuit 54 supplies the catheter drive current based on the series-path-current signal and current flowing through the three-wire catheter 22. Drive resistors and a current limiter 56 are connected to the current driver 54 to adjust, and if necessary limit, the catheter drive current. In one embodiment, the drive current ranges from 0 to 15 microamperes. In the current sense circuit 52, a span-adjust circuit 58 modifies the series-path-current signal to adjust the amplitude range of the drive current such that the impedance converter module 20 provides the target resistance-temperature characteristic to the monitor 24 at the 2-wire connector 28.

An offset-adjustment circuit 60 is coupled to the ratiometric current mirror circuit and will be described in further detail below.

In response to the catheter drive current, the impedance converter module 20 receives the three-wire ratiometric signal from the catheter 22 via the three-wire connector 36. Respective summing differential amplifiers 62 provide measurement signals that represent a voltage drop across a pad resistor and a thermistor in the catheter 22.

A summing node 64 combines the measurement signals from the summing amplifiers 62 to provide a single-ended ratiometric signal that represents the sensed temperature. The offset-adjustment circuit 60 is coupled to the summing node 64, and is used to compensate for offset in the summing differential amplifiers 62. To do so, the offset-adjustment circuit 60 adjusts the voltage of the single-ended ratiometric signal to provide a calibrated ratiometric signal. In an alternate embodiment, the offset-adjustment circuit 60 is not used.

An output-voltage-sense circuit 70 provides a total-sense signal representing the voltage across the series current path 42.

An error amplifier circuit 80 subtracts the calibrated ratiometric signal from the total-sense signal to provide an error signal that controls the voltage across the variable impedance source 44. In this way, when the excitation signal is a constant current, by adjusting the voltage drop across the variable impedance source 44 in accordance with the measured temperature, the impedance converter module 20 appears to be a two-terminal, resistive element at the two-wire connector 28.

Figure 3A:
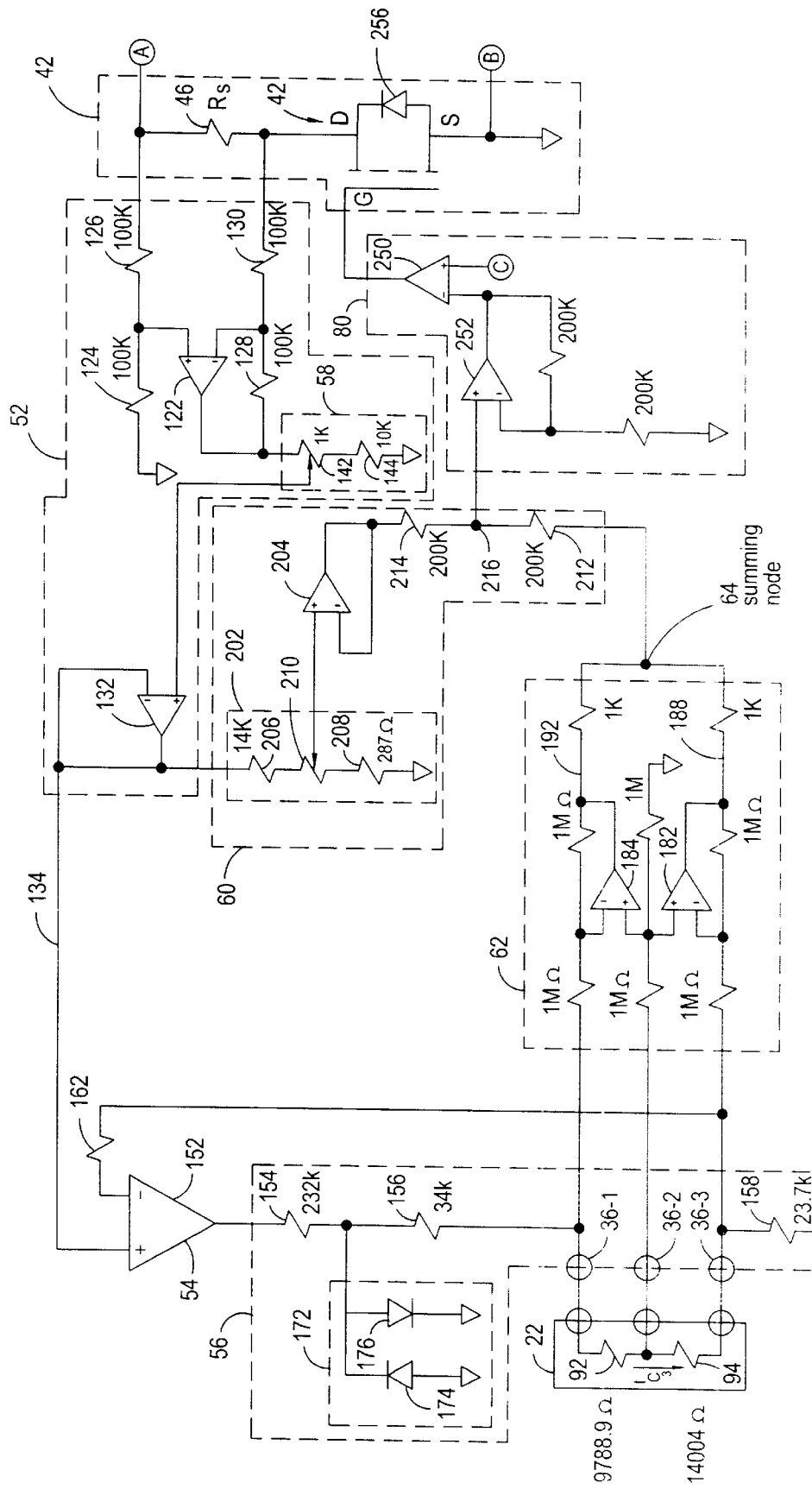
FIGS. 3A and 3B depict a circuit diagram of the impedance converter module of FIG. 2.
Figure 3B:
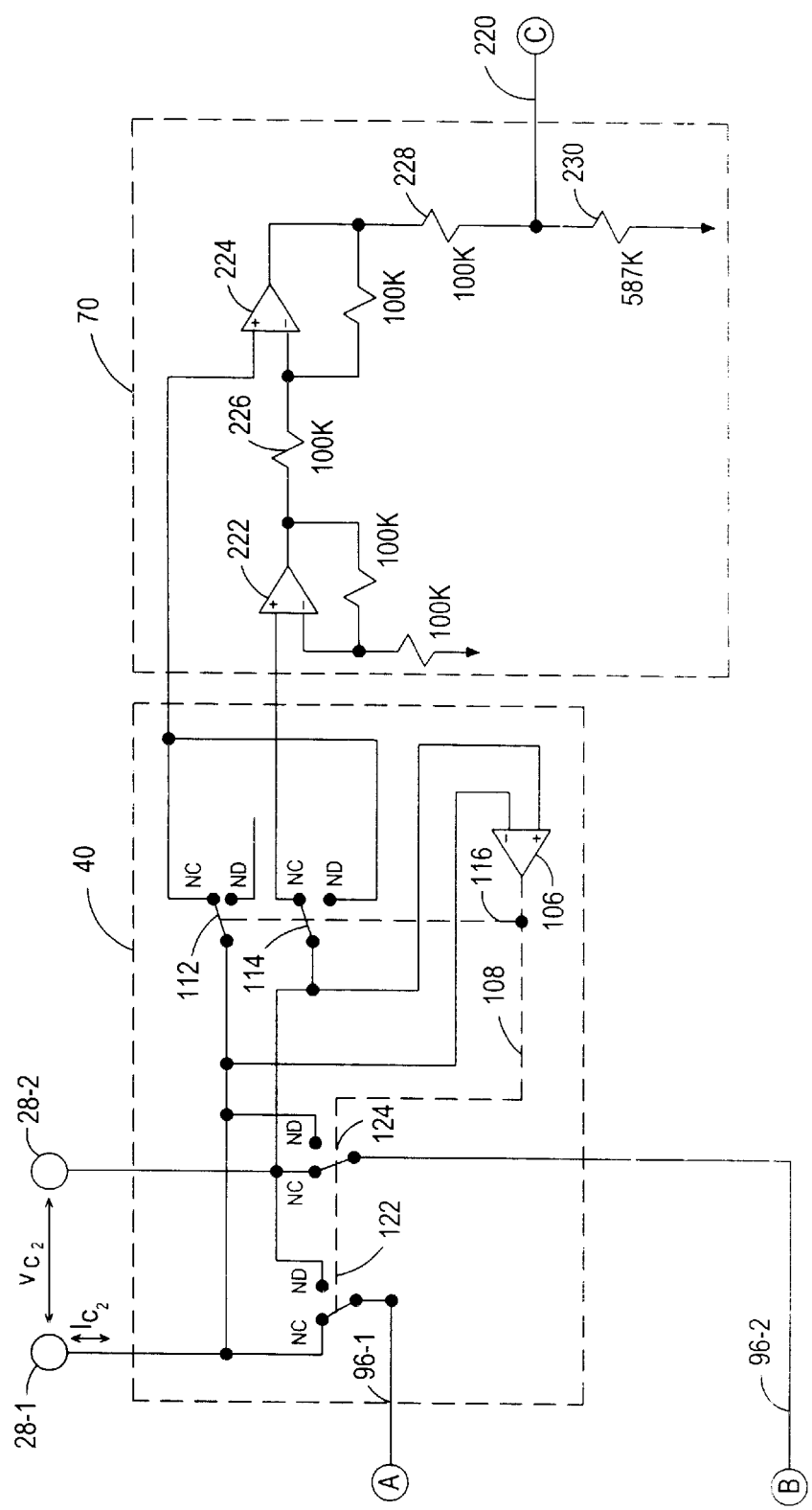

FIGS. 3A and 3B depict a circuit diagram of the impedance converter module with a catheter. Referring to FIG. 3A, in the 3-wire catheter 22, a pad resistor 92 and thermistor 94 are connected in series. The ratio of the resistance of the pad resistor 92 to the thermistor value reflects the temperature measurement. The pad resistor 92 and thermistor 94 are coupled to the three-wire connector 36 to provide the three-wire ratiometric response signal in response to the catheter drive signal. The ratiometric response signal comprises a pad resistor voltage representing a voltage drop across the pad resistor 92, and a thermistor voltage representing a voltage drop across the thermistor 94.

Referring now to FIG. 3B, the impedance converter module 20 will be discussed in further detail starting with the phase reversal circuit 40. The phase reversal circuit 40 receives the 2-wire excitation signal on terminals 28-1 and 28-2 and provides the polarized excitation signal with a predetermined polarity on leads 96-1 and 96-2. In the phase reversal circuit 40, CMOS switches 102 and 104 having normally open (NO), common (COM), and normally closed (NC) terminals are controlled by a CMOS analog comparator 106 as shown by dashed line 108. When the analog comparator 106 detects the polarity of the voltage across the impedance converter module's input terminals 28-1 and 28-2, an output state of either 1, or in an alternate embodiment 0, drives the CMOS switches 102 and 104, to provide a polarized excitation signal with a predetermined polarity across the series current path 42. CMOS switches 112 and 114 are similarly controlled, as shown by dashed line 116, to couple the series current path 42 to the input of the output-voltage-sense circuit 70 to determine the voltage across the series current path 42.

Referring now to FIG. 3A, the polarized excitation signal is applied to the series current path 42 which comprises the sense resistor Rs 46 and the variable impedance source 44 such that a positive bias is applied to the variable impedance source 44. The variable impedance source 44 is controlled to provide a response signal having the target resistance-temperature characteristic expected by the monitor 24.

The ratiometric current mirror circuit 50 provides a drive signal that is applied to the 3-wire catheter 22 based on the polarized excitation signal and the operational characteristics of the 3-wire catheter 22. The current-sense circuit 52 detects current flowing through the sense resistor Rs 46. A first differential amplifier 122 acts as a voltage-to-current converter to determine the voltage drop across, and therefore the current flowing through, the sense resistor Rs 46. Resistors 124, 126, 128, and 130 each have the same value, for example, 100K ohms, so that the first differential amplifier 122 has unity gain. In an alternate embodiment, the first differential amplifier 122 does not have unity gain. The output of the first differential amplifier 122 is supplied to a second differential amplifier 132. The second differential amplifier 132 has a unity gain and is used as a buffer to supply the series-path-current signal on lead 134 which is a voltage level that represents current flowing though the sense resistor to the current driver 54. In an alternate embodiment, the second differential amplifier 132 is not used and the first differential amplifier 122 is connected directly to the current driver circuit 54. In yet another alternate embodiment, the second differential amplifier 132 does not have unity gain.

In another embodiment, a span-adjustment circuit 58 adjusts the span, that is, the amplitude of the current supplied by the current driver circuit 54. A span-adjustment potentiometer 142 is coupled to the output of the first differential amplifier 122 and to the positive input of the second differential amplifier 132. A fixed-span resistor 144 is connected between the span-adjust potentiometer 142 and ground. The span-adjustment potentiometer 142 is adjusted to accommodate, at least in part, for the difference in the resistance-temperature characteristic of the thermistor of the target 2-wire catheter and the thermistor 94 used in the 3-wire catheter 22. The span-adjustment potentiometer 142 is calibrated to provide a desired change in the voltage across terminals 28-1 and 28-2 at predetermined high and low temperature extremes at a predetermined excitation current.

The current driver circuit 54 has a current-driver differential amplifier 152 to supply the catheter drive current to the 3-wire catheter 22. Current flows through first and second drive resistors 154 and 156, respectively, to one side of the catheter 22, through the catheter 22, and through a third drive resistor 158 to ground. The voltage at the catheter end of the third drive resistor 158 is supplied, as a catheter-feedback signal, to the negative input of the current-driver differential amplifier 152 via catheter-feedback resistor 162. The catheter-feedback signal is proportional to the amount of current flowing through the catheter 22. A positive input of the current-driver differential amplifier 152 receives the series-path-current signal that represents the amount of current flowing through the series path. Based on the series-path-current signal and the catheter-feedback signal, the current-driver differential amplifier adjusts the amount of drive current flowing through the catheter 22.

The current limiter 172 is connected between the first and second drive resistors, 154 and 156, respectively, to limit the current to approximately 1.681 milliamperes, and to limit the voltage across the catheter to approximately +−0.74 volts. In one embodiment, the current limiter 172 is implemented as two back-to-back diodes, 174 and 176, connected in parallel.

In the summing differential amplifier block 62, first and second differential amplifiers, 182 and 184, sense the voltage output by the thermistor 94 and pad resistor 92, respectively. In one embodiment, the summing differential amplifiers 182 and 184 are symmetrical. The summing differential amplifiers 182 and 184 have a unity gain. Alternately, the summing differential amplifiers 182 do not have a unity gain. The first summing differential amplifier 182 senses a voltage drop across the thermistor 94 and generates a first measurement signal representing that voltage drop across the thermistor 94 on lead 188. The second summing differential amplifier 184 senses a voltage drop across the pad resistor 92 and generates a second measurement signal representing that voltage drop on lead 192.

The summing node 64 receives the first and second measurement signals via summing resistors 194 and 196, respectively, and combines the first and second measurement signals to provide a single-ended-measured-temperature signal, a voltage, that represents the measured temperature. The first and second summing differential amplifiers, 182 and 184, respectively, are coupled at the summing node 64 such that their outputs are opposing.

The offset-adjustment circuit 60 is used to calibrate the single-ended-measured-temperature signal to accommodate for offset in the first and second summing differential amplifiers 182 and 184. The offset-adjustment circuit 60 is connected to the output of the current sense circuit 52. An offset-adjustment series resistor network 202 is connected to the positive input of an offset-adjustment differential amplifier 204. In one embodiment, the offset-adjustment differential amplifier 204 has unity gain. In an alternate embodiment, the offset-adjustment differential amplifier 204 does not have a unity gain. The offset-adjustment series resistor network 202 has first and second offset-adjustment resistors 206 and 208, respectively, and a offset-adjustment potentiometer 210. In one embodiment, the offset-adjustment potentiometer 210 has a low resistance range, such as 0–100 ohms. The offset-adjustment differential amplifier 204 acts as a buffer between the offset-adjustment series resistor network 202 and the summing node 64. The summing node 64 is coupled to the error amplifier circuit 80 by a first offset-output resistor 212, such as a 200K ohm resistor, and the offset-adjustment circuit 60 is coupled to the error amplifier circuit 80 by a second offset-output resistor 214, another 200K ohm resistor. The first and second offset-output resistors 212 and 214, respectively, are connected together at an input 216 to the error amplifier circuit 80. The offset-adjustment circuit 60 adjusts the voltage at the input 216 to the error amplifier circuit 80 to provide the calibrated ratiometric signal.

The offset-adjustment potentiometer 210 is calibrated by supplying the excitation signal on the 2-wire connector 28, and by supplying a ratiometric response signal corresponding to a predetermined nominal temperature at the three-wire connector 36. The offset-adjustment potentiometer 210 is adjusted such that the response signal at the 2-wire connector 28 reaches a predetermined expected value for the nominal temperature.

Referring to FIG. 3B, the output-voltage-sense circuit 70 provides a sensed-output-voltage signal on lead 220 representing the voltage across the series current path 42 of the impedance converter module 20. First and second sensed-output differential amplifiers, 222 and 224, respectively, receive a polarized voltage from the phase reversal circuit 40 that corresponds to the voltage across the series-current-path 42, and generates the sensed-output-voltage signal. The output of the first sensed-output differential amplifier 222 is connected to the negative input of the second sensed-output differential amplifier 224 via a first sensed-output resistor 226. The output of the second differential amplifier 224 is connected to second and third sensed-output resistors 228 and 230 connected in series. The voltage between the second and third sensed-output resistors 228 and 230 is supplied, as the sensed-output-voltage signal, to the error amplifier circuit 80.

Referring back to FIG. 3A, the error amplifier circuit 80 has an error differential amplifier 250 and an input differential amplifier 252. The input differential amplifier 252 receives the calibrated ratiometric signal and the sensed-output-voltage signal, and outputs an error signal which is a voltage representing the difference between the calibrated ratiometric signal and the sensed-output voltage signal. In an alternate embodiment, the input differential amplifier 252 is not used.

A variable impedance source 42, in response to the error signal, adjusts its output voltage in the series-current-path. In one embodiment, the variable impedance source 42 is implemented with a MOSFET; and the current flows from the drain D to the source S of the MOSFET. The MOSFET 42 has an internal parasitic diode 256 across its drain D and source S. Because the polarized excitation signal applies a positive bias to the drain of the MOSFET 42, the error signal will not have a value that "turns-on" the MOSFET 42, thereby operating the MOSFET 42 in it's linear region. In particular, the gate G of the MOSFET 42 is modulated by the error signal to regulate the effective total impedance presented at the two-wire connector 28. The voltage drop across the MOSFET 42 can be adjusted, and thereby provide an output that appears to be resistive. In an alternate embodiment, the variable impedance source 42 is implemented with a bipolar transistor.

This circuit effectively provides a precise impedance to the monitor 24 which corresponds to the ratio of the pad resistor 92 to the resistance of the thermistor 94 to provide a response signal in accordance with the measured temperature. By selecting offset-adjustment and span adjust points for a given thermistor via the offset-adjustment potentiometer and the span-adjust potentiometer, respectively, the target resistance-temperature characteristic can be achieved at the two-wire connector while maintaining tight tolerances.

Figure 4:
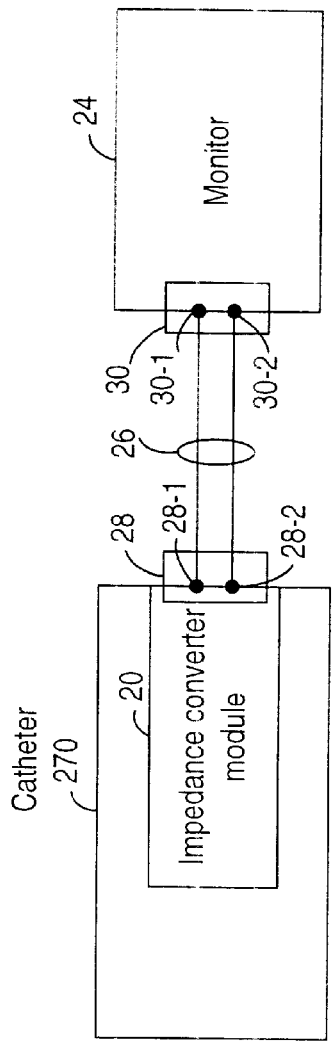
FIG. 4 depicts a high level block diagram of the impedance converter module integrated into a catheter.

FIG. 4 depicts an alternate embodiment in which the impedance converter module is integrated into a catheter.

Those skilled in the art will clearly realize that the teachings of the present invention can be utilized in substantially any application to convert a three-wire ratiometric impedance to a two-wire resistance. The impedance converter module 20 can be used standalone, or the impedance converter module 20 can be integrated as a component into a sensor device (FIG. 4), such as a catheter 270. In addition, the impedance converter module 20 may be implemented on an application specific integrated circuit (ASIC).

Although various embodiments, each of which incorporates the teachings of the present invention, have been shown and described in detail herein, those skilled in the art can readily devise many other embodiments that still utilize these teachings.

What is claimed is:

1. An impedance converter module comprising:
    a phase reversal circuit to receive a 2-wire excitation signal at first and second terminals, and to provide a polarized excitation signal with a predetermined polarity based on the 2-wire excitation signal;
    a series current path comprising a sense resistor connected in series with a variable impedance source, the polarized excitation signal being applied across the series current path;
    an output-voltage-sense circuit to provide an output-voltage-sense signal based on a voltage across the series current path;
    a current mirror to provide a drive signal to a ratiometric device based on current flowing through the series current path;
    differential amplifiers to receive a ratiometric response signal from the ratiometric device, and to output measurement signals based on the ratiometric signal; and
    a summing node to combine the measurement signals to provide a single-ended ratiometric signal;
    wherein the variable impedance source is controlled to provide a two-wire response signal at the 2-wire terminals based on the single-ended ratiometric signal and the output-voltage-sense signal.

2. The impedance converter module of claim 1 wherein the ratiometric signal comprises a first input voltage and a variable input voltage, and the single-ended ratiometric signal represents a difference between the first input voltage and the variable input voltage.

3. The impedance converter module of claim 2 wherein the variable input voltage is supplied by a thermistor.

4. The impedance converter module of claim 1 wherein the variable impedance source comprises a MOSFET.

5. The impedance converter module of claim 4 wherein the polarized excitation current flows from drain to source of the MOSFET.

6. The impedance converter module of claim 4 wherein the MOSFET is not forward biased beyond a potential that may turn on the MOSFET.

7. The impedance converter module of claim 1 wherein the phase reversal circuit comprises first and second switches coupled to the two-wire connector to provide the polarized excitation signal across the series current path with a predetermined polarity.

8. The impedance converter module of claim 1 wherein the current mirror comprises:
    a current-sense differential amplifier coupled in parallel to the sense resistor to provide a current-sense signal representing current flowing through the series current path, wherein the current mirror generates the drive current based on the current-sense signal.

9. The impedance converter module of claim 1 further comprising:
an offset-adjustment circuit coupled to the summing node to adjust the single-ended ratiometric signal for offset in the differential amplifiers.

10. The impedance converter module of claim 1 further comprising:
a span-adjustment circuit coupled to the current driver to adjust the amplitude range of the drive current.

11. The impedance converter module of claim 1 wherein the differential amplifiers, the phase reversal circuit, the current mirror, the differential amplifiers, and variable impedance source are implemented on an integrated circuit.

12. A impedance converter module comprising:
a thermistor to sense a temperature;
a pad resistor coupled to the thermistor, wherein the output of the pad resistor and the thermistor provide a ratiometric response signal; and an impedance converter circuit comprising:
  a phase reversal circuit to receive a 2-wire excitation signal at first and second terminals, and to provide a polarized excitation signal with a predetermined polarity based on the 2-wire excitation signal;
  a series current path comprising a sense resistor connected in series with a variable impedance source, the polarized excitation signal being applied across the series current path;
  an output-voltage-sense circuit to provide an output-voltage-sense signal based on a voltage across the series current path;
  a current mirror to provide a drive signal to the pad resistor and thermistor based on current flowing through the series current path;
  differential amplifiers to receive the ratiometric response signal, and to output measurement signals based on the ratiometric signal; and
  a summing node to combine the measurement signals to provide a single-ended ratiometric signal;
  wherein the variable impedance source is controlled to provide a two-wire response signal at the 2-wire terminals based on the single-ended ractiometric signal and the output-voltage-sense signal.

13. The impedance converter module of claim 12 wherein the variable impedance source comprises a MOSFET.

14. The impedance converter module of claim 13 wherein the polarized excitation current flows from drain to source of the MOSFET.

15. The impedance converter module of claim 13 wherein the MOSFET is not forward biased beyond a potential that may turn on the MOSFET.

16. The impedance converter module of claim 12 wherein the phase reversal circuit comprises first and second switches coupled to the two-wire connector to provide the polarized excitation signal across the series current path with a predetermined polarity.

17. The impedance converter module of claim 12 wherein the current mirror comprises:
a current-sense differential amplifier coupled in parallel to the sense resistor to provide a current-sense signal representing current flowing through the series current path, wherein the current mirror generates the drive current based on the current-sense signal.

18. The impedance converter module of claim 12 further comprising:
an offset-adjustment circuit coupled to the summing node to adjust the single-ended ratiometric signal for offset in the differential amplifiers.

19. The impedance converter module of claim 12 further comprising:
a span-adjustment circuit coupled to the current driver to adjust the amplitude range of the drive current.

20. The impedance converter module of claim 12 wherein the differential amplifiers, the phase reversal circuit, the current mirror, the differential amplifiers, and variable impedance source are implemented on an integrated circuit.

* * * * *